United States Patent [19]

Rutt

[11] Patent Number: 4,710,727
[45] Date of Patent: Dec. 1, 1987

[54] NONLINEAR DISTORTION SYNTHESIZER USING OVER-THRESHOLD POWER-FUNCTION FEEDBACK

[75] Inventor: Thomas E. Rutt, Asbury Park, N.J.

[73] Assignee: Aardvark Audio Inc., Asbury Park, N.J.

[21] Appl. No.: 892,350

[22] Filed: Aug. 1, 1986

Related U.S. Application Data

[63] Continuation-in-part of Ser. No. 771,235, Aug. 30, 1985, abandoned.

[51] Int. Cl.$^4$ .............................................. H03F 1/34
[52] U.S. Cl. .................................... 330/110; 330/103; 330/149; 330/291
[58] Field of Search .......................... 307/359, 490, 529; 330/103, 107, 109, 110, 149, 291, 294

[56] References Cited

U.S. PATENT DOCUMENTS

| | | | |
|---|---|---|---|
| 3,211,901 | 10/1965 | Conley et al. | 307/490 X |
| 3,268,830 | 8/1966 | Rugsdale | 330/110 |
| 3,281,585 | 10/1966 | Zseleczky et al. | 307/490 X |
| 3,284,726 | 11/1966 | Kotecki | 333/14 |
| 3,405,286 | 10/1968 | Mudie | 307/490 X |
| 4,318,053 | 3/1982 | Sondermeyer | 330/281 |
| 4,459,557 | 7/1984 | McQuilken | 330/282 |
| 4,506,174 | 3/1985 | Hitt | 307/490 |

FOREIGN PATENT DOCUMENTS 2040634 8/1980 United Kingdom ................ 330/103

OTHER PUBLICATIONS

Duncan, et al., "Design Criteria . . . ", J. Audio Eng. Soc., vol. 23, No. 8, Oct. 1975, pp. 610-621.
Blesser, et al., "Analysis of a Feedback Controlled Limiter . . . ", IEEE Audio & Electroacoustics, vol. AU-16, No. 4, Dec. 1968, pp. 481-585.
Noble, et al., "A Dual-Band Audio Limiter", J. Audio Eng. Soc., vol. 17, No. 6, Dec. 1969, pp. 678-684.
"Low Cost IC Mult., Divid., Square & Sq. Rooter AD533", Analog Devices Application Note.
"Programmable Analog Compandor NE572", Signetics Analog Data Manual 1983, pp. 5-17 to 5-22.
"Multifunction Devices: Powers & Roots", Analog Devices Nonlinear Device Handbook, chapter 6, pp. 369-377, 1974.
Seeley, *Electronic Circuits*, Holt, Rinehart & Winston, 1968, pp. 270-273.
Jung, *IC Op-Amp Cookbook*, H. W. Sams, 1980, pp. 210-213, 250-257.

Primary Examiner—Eugene R. LaRoche
Assistant Examiner—Steven J. Mottola
Attorney, Agent, or Firm—M. Einschlag

[57] ABSTRACT

A nonlinear distortion synthesizer having an amplifier and one or more over-threshold power-function negative-feedback paths. Each negative-feedback path provides a feedback signal which is separately adjustable for each signal polarity. The feedback signal for each polarity is proportional to a power function of the portion of the output signal which exceeds a predetermined threshold.

22 Claims, 15 Drawing Figures

OPFDS INPUT/OUTPUT SIGNAL-TRANSFER CHARACTERISTICS CURVE

NONLINEAR DISTORTION SYNTHESIZER USING OVER-THRESHOLD POWER-FUNCTION FEEDBACK

This is a continuation-in-part of patent application Ser. No. 771,235 filed on Aug. 30, 1985, now abandoned.

BACKGROUND OF INVENTION

This invention pertains to the field of nonlinear distortion synthesizers and, in particular, to nonlinear distortion synthesizers using feedback.

In the field of analog signal amplification, recording and playback there is a need for a simple, inexpensive apparatus to control distortion. Such distortion often results when a recording medium or a portion of an amplifier saturates. Therefore, one method of distortion control involves avoiding saturation by reducing input signal levels. However, if the input is reduced too much, the output signal will get lost in ever-present circuit noise. For this reason, such a solution limits a system's input dynamic range to the region between the level where the output is lost in circuit noise and the level where saturation occurs. A substantial number of applications cannot be limited to this input dynamic range.

There are two basic categories of devices disclosed in the prior art which address the distortion problem; namely the compressor and limiter category, and the nonlinear distortion synthesizer category.

COMPRESSORS AND LIMITERS

One method for distortion control in the prior art involves the use of devices known as compressors, which are often used with expanders, and limiters. A compressor prevents distortion by compressing a signal's dynamic range to fit within the dynamic range limitations of a recording medium or critical signal path. An expander can be used to restore the dynamic range of the compressed signal back to that of the original input signal. A limiter reduces the magnitude of a signal, similar to a compressor, but a limiter is designed for no expansion at the output of the system.

Compressors and limiters usually employ gain-controlled amplifiers whose gain is adjusted in response to signal energy level. The gain-control circuits used in these apparatus typically have attack and release times associated with their operation. As a result, if the input signal energy level remains constant for some time interval the gain of these apparatus also remains constant. Thus, the output signal will maintain the original quality of the input signal, but at a lower signal level. Consequently, such apparatus are like manual gain control, which has lag and lead time delays.

NONLINEAR DISTORTION SYNTHESIZERS

An alternative method for distortion control in the prior art involves the use of nonlinear distortion synthesizers. These nonlinear distortion synthesizers instantaneously follow the signal without attack and release times. These synthesizers have a nonlinear distortion characteristic which is below saturation, however they do distort the signal. These synthesizers are useful because there are applications where certain distortion characteristics are desired. One such example is in musical instrument applications where guitar players desire the type of distortion inherent in vacuum-tube amplifiers.

Two examples of nonlinear distortion synthesizers disclosed in the prior art are a piecewise-linear distortion synthesizer and a square root circuit. A piecewise-linear distortion synthesizer typically comprises a multiplicity of separate linear regions of operation. As a result, such a synthesizer has harsh changes in its input-/output signal-transfer characteristic as the synthesizer makes transitions between its linear regions of operation. The prior art discloses that the detectable nature of these changes can be reduced by adding a large number of linear regions of operation into the piecewise-linear distortion synthesizer. However, this drastically increases the cost of such a device.

A square root circuit typically comprises a squaring device in a negative feedback path, and has a continuous and smoothly varying input/output signal transfer characteristic. A square root circuit does not produce harsh changes in operation, as does the piecewise-linear distortion synthesizer, because its input/output signal-transfer characteristic follows a smooth curve. Nevertheless, the square root circuit does not have a linear region of operation for low signal levels. Thus, square root circuits produce noticeable distortion at all signal levels.

There is a need for an apparatus which instantaneously controls signal distortion (unlike compressors and limiters which have attack and release times), which doesn't exhibit harsh changes in operation (unlike piecewise-linear distortion synthesizers which have harsh changes as they switch between their linear regions of operation), and which can have a linear region of operation for low signal levels (unlike square root circuits which produce signal distortion at all signal levels).

SUMMARY OF THE INVENTION

A nonlinear distortion synthesizer in accordance with the present invention advantageously has instantaneous operation, no harsh changes in its operation, and a linear region of operation for low signal levels. The inventive synthesizer comprises signal-mixing means responsive to an input signal and one or more nonlinear feedback signals, an amplifier responsive to output from the signal-mixing means, and one or more over-threshold power-function feedback paths responsive to amplifier output, each providing one of the nonlinear feedback signals.

An over-threshold power-function feedback path comprises a peak-pass means, responsive to the amplifier output signal, and a polarity-preserving power-function means, responsive to the output of the peak-pass means. The peak-pass means has zero output signal level when the amplifier output signal level is below predetermined thresholds. The output of the polarity-preserving power-function means, i.e. a nonlinear feedback signal, is applied to a signal-mixing means along with the system input signal. The signal-mixing means drives the amplifer with over-threshold power-function negative feedback. In a preferred embodiment, a separate predetermined threshold can be used for each polarity of the amplifier output. Specifically, the peak-pass means provides an output signal proportional to the difference between the amplifier output signal level and the value of the predetermined threshold for each amplifier output signal polarity.

Embodiments of the present invention provide a range of linear operation when the system output level is below the predetermined peak-pass thresholds. Because a power function increases slowly with increasing input when its input level is small, there are no abrupt changes in the invention's input/output signal-transfer characteristic as each of the over-threshold power function feedback signals becomes active. Thus, the present invention advantageously provides a system with a continuous and smoothly varying input/output signal-transfer characteristic, while maintaining its output signal level below saturation limitations.

BRIEF DESCRIPTION OF DRAWINGS

A complete understanding of the present invention may be gained by considering the following detailed description in conjunction with the accompanying drawings, in which.

Figure 2:
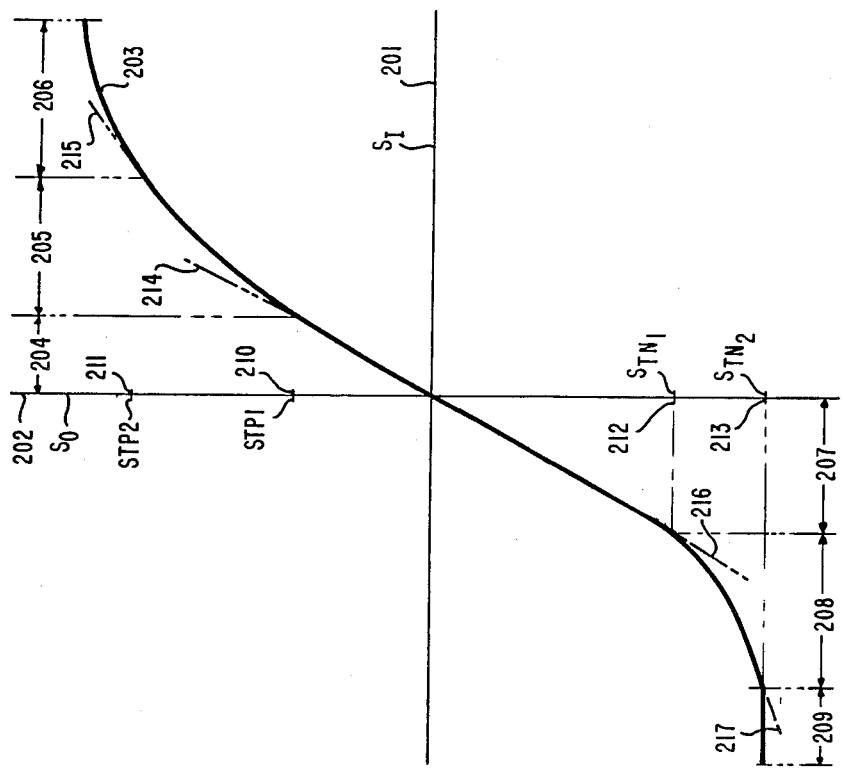
FIG. 2 shows an input/output signal-transfer characteristic curve produced by an over-threshold power-function feedback distortion synthesizer (OPFDS) in accordance with the present invention.

To facilitate understanding, indentical reference numerals are used to designate elements common to the figures.

DETAILED DESCRIPTION OF INVENTION

Figure 1:
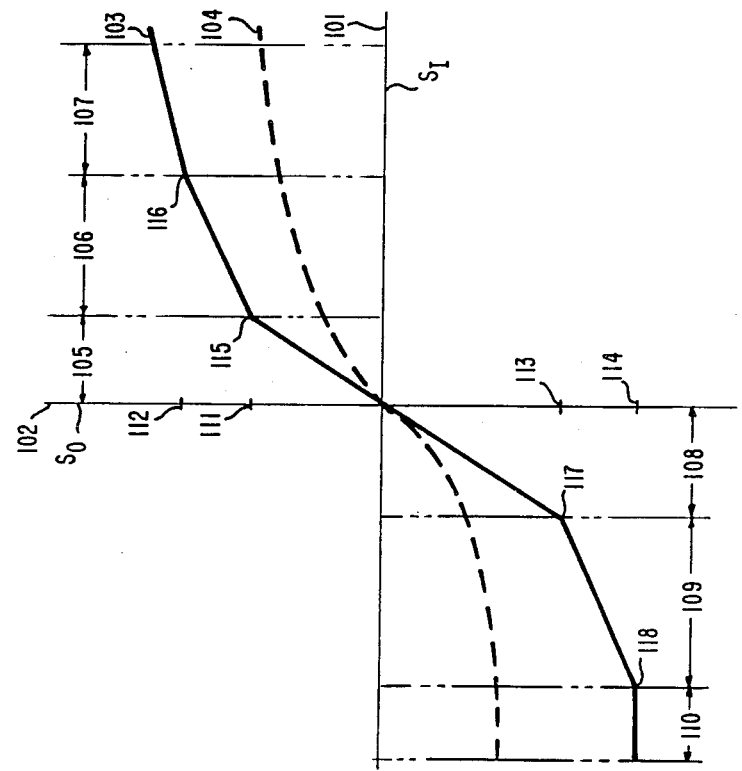
FIG. 1 shows input/output signal-transfer characteristic curves for a piecewise-linear function synthesizer, curve 103, and a square root circuit, curve 104, disclosed in the prior art.

FIG. 1 shows an input/output signal-transfer characteristic curve 103 for a prior-art piecewise-linear function synthesizer. The projection of input/output signal-transfer characteristic curve 103 onto horizontal axis 101 is input signal level $S_I$. The projection onto vertical axis 102 is output signal level $S_O$. Analysis of curve 103 is aided by separating the input signal range into mutually exclusive regions of operation 105-110. Within each of the regions 105-110, curve 103 follows a straight line relationship. The slope of the line is different in each region.

Transition from one region to the next occurs when the output signal level 102 becomes greater than one of the positive thresholds 111 or 112, or less than one of the negative thresholds 113 or 114. Piecewise-linear function synthesizers are characterized by sharp slope changes 115, 116, 117 and 118 in the input/output signal-transfer characteristic curve 103. These sharp changes become evident as high frequency harshness in the output signal. They require many regions of operation to simulate a smooth curve, with increasing expense.

In FIG. 1, the input/output signal-transfer characteristic curve 104 shows the characteristics of a prior art square root circuit. Curve 104 is continuous and smooth, but does not have a linear mode of operation in the low level input signal ranges 105 and 108. Square root circuits in the prior art are produced by using squaring devices as feedback paths around high-gain amplifiers. In these devices the entire output signal range passes through the squaring feedback element, and its effect is present for all signal levels. Another device (U.S. Pat. No. 4,506,174) improves the linearity of a square root circuit for low signal levels by switching an additional linear feedback path into operation when the amplifier input falls below a predetermined threshold. This device is limited in that it still passes the entire output signal range through the squaring feedback path, and it works only with single-polarity signals.

Embodiments of the present invention have a smooth and continuous input/output signal-transfer characteristic curve, as shown by curve 203 of FIG. 2. In regions 204 and 207, the output signal level projected onto vertical axis 202 has not reached any of the predetermined thresholds 210, 211, 212 and 213. Curve 203 follows a linear relationship in regions 204 and 207. The extrapolations of this linear relationship into regions 205 and 208 are shown as straight line segments 214 and 216. When the output signal level projected onto axis 202 becomes greater than a positive threshold 210, or less than a negative threshold 212, curve 203 in over-threshold regions 205 and 206 deviates from segments 214 and 215, extrapolated from regions 204 and 207.

The input/output signal-transfer characteristics 203 follows a curved relationship in regions where the output signal level is greater than a predetermined threshold 210, 211, 212 or 213. The extrapolations of the curved relationship in regions 205 and 208 into regions 206 and 209 is shown as curve segments 215 and 217. Curve 203 deviates from the extrapolated segments 214, 215, 216 and 217. Note however, that the curve segments in over-threshold regions 205, 206, 208 are smooth continuations of the curve segment in the preceeding region. In region 209 however, the input/output curve 203 reaches a saturation condition, and there is a sharp transition at the threshold 213 due to the hard limit. The design parameters of this invention can be set so that it has a wide range of operation without saturation.

Figure 3:
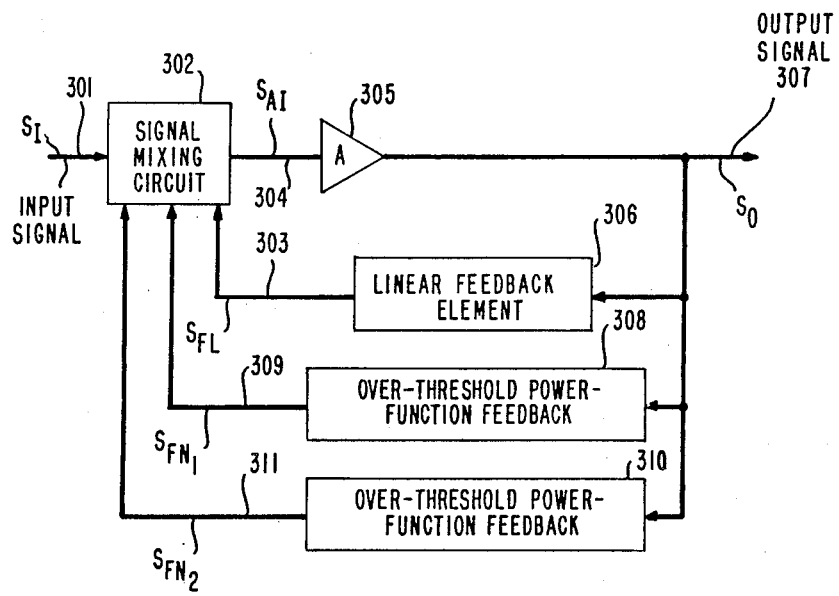
FIG. 3 is a block diagram of an embodiment of the present invention.

FIG. 3 is a block diagram of a preferred embodiment of the present invention. Signal-mixing circuit 302 mixes input signal 301 with feedback signal 303 and one or more over-threshold power-function feedback signals 309 and 311. Circuit 302 produces signal 304 driving amplifier 305. Feedback element 306 is included in this block diagram since most amplifiers designed today have some form of linear feedback in their circuitry, and it simplifies the description of preferred embodiments of the present invention.

Signal-mixing circuit 302 ensures that over-threshold power-function feedback signals 309 and 311 drive amplifier 305 with opposite polarity to the input signal 301 (negative feedback). The design of signal-mixing circuit 302 depends on the gain polarity of amplifier 305, and the polarities of each of the feedback elements 306, 308, and 310. Each of the output signals 303, 309 and 311 is either of the same polarity as or of opposite polarity to output signal 307. Signal-mixing circuit 302 provides amplifier input signal 304 driving amplifier 305, which in turn produces output signal 307. Output signal 307 drives feedback element 306 and each over-threshold power-function feedback element 308 and 310. When output signal 307 changes polarity, signals 303, 309 and 311 also change polarity in response to 307.

The most general aspect of the present invention merely requires only one over-threshold power-function feedback signal driving signal-mixing circuit 302, and does not require feedback element 306. Nevertheless, the embodiment shown in FIG. 3 includes these elements to illustrate that the present invention also covers apparatus including such extra means.

Figure 4:
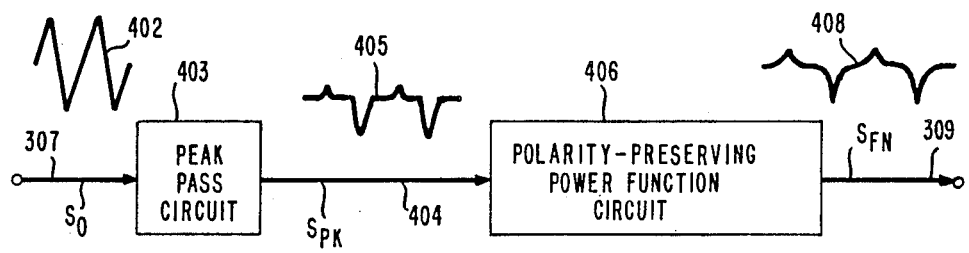
FIG. 4 is a block diagram of an embodiment of an over-threshold power-function feedback path used in the present invention.

An embodiment of over-threshold power-function feedback element 308 is described in the block diagram, FIG. 4. Amplifier output signal 301 drives peak pass circuit 403, which picks off positive or negative signal peaks and can vary the amplitude of either of them independently. Circuit 403 produces peak-over-threshold signal 404. There are well-known techniques for constructing peak pass circuit 403, which is also known as a dead band circuit. For example, circuits are shown in the text "Electronics Circuits", authored by Seely in 1968, pp 271-273. Peak-over-threshold signal 404 is applied to polarity-preserving power-function circuit 406, producing over-threshold power-function feedback signal 309. There are well-known techniques for constructing polarity-preserving power-function circuit 406. For example, circuits are shown in the text "IC Op-Amp Cookbook", authored by June in 1974, pp. 210-213 and 251-256. By adusting circuit element values in well-known peak-pass circuit and polarity-preserving power-function circuit designs, various input/output signal-transfer characteristics can be synthesized by the present invention, as shown in curve 203 (FIG. 2).

In another example, triangle wave signal 402 applied to peak pass circuit 403 produces asymmetric peak-over-threshold signal 405. Signal 405 drives polarity-preserving power-function circuit 406 producing asymmetric over-threshold power-function feedback signal 408. Note that the straight line signal slopes in 405 are transformed by the polarity-preserving power-function circuit 406 into parabolic shapes in 408, with no sharp changes in signal level.

The input/output characteristic of peak pass circuit 403 is designed to substantially follow Equation 1: ($K_{TN}$ and $K_{TP}$ are design parameters which have the same polarity, $S_{TP}$ and $S_{TN}$ are design thresholds, and are realized using preselected peak-pass circuit elements.)

$$\begin{cases} S_{PK} = K_{TP}*(S_O - S_{TP}), \text{ for } S_O \text{ greater than or equal to } S_{TP} \\ S_{PK} = 0, \text{ for } S_O \text{ less than } S_{TP} \text{ and greater than } S_{TN} \\ S_{PK} = K_{TN}*(S_O - S_{TN}), \text{ for } S_O \text{ less than or equal to } S_{TN} \end{cases} \quad (1)$$

The input/output characteristic of polarity-preserving power-function circuit 406, is designed to substantially follow Equation 2: (the powers b and c are design parameters which are greater than 1, $K_{MP}$ and $K_{MN}$ are design parameters which have the same polarity, and are realized using preselected polarity-preserving power-function circuit elements)

$$\begin{cases} S_{FN} = K_{MP}*S_{PK}^b \text{ when } S_{PK} \text{ is greater than or equal to } 0 \\ S_{FN} = -K_{MN}*|S_{PK}|^c \text{ when } S_{PK} \text{ is less than } 0 \end{cases} \quad (2)$$

Figure 5:
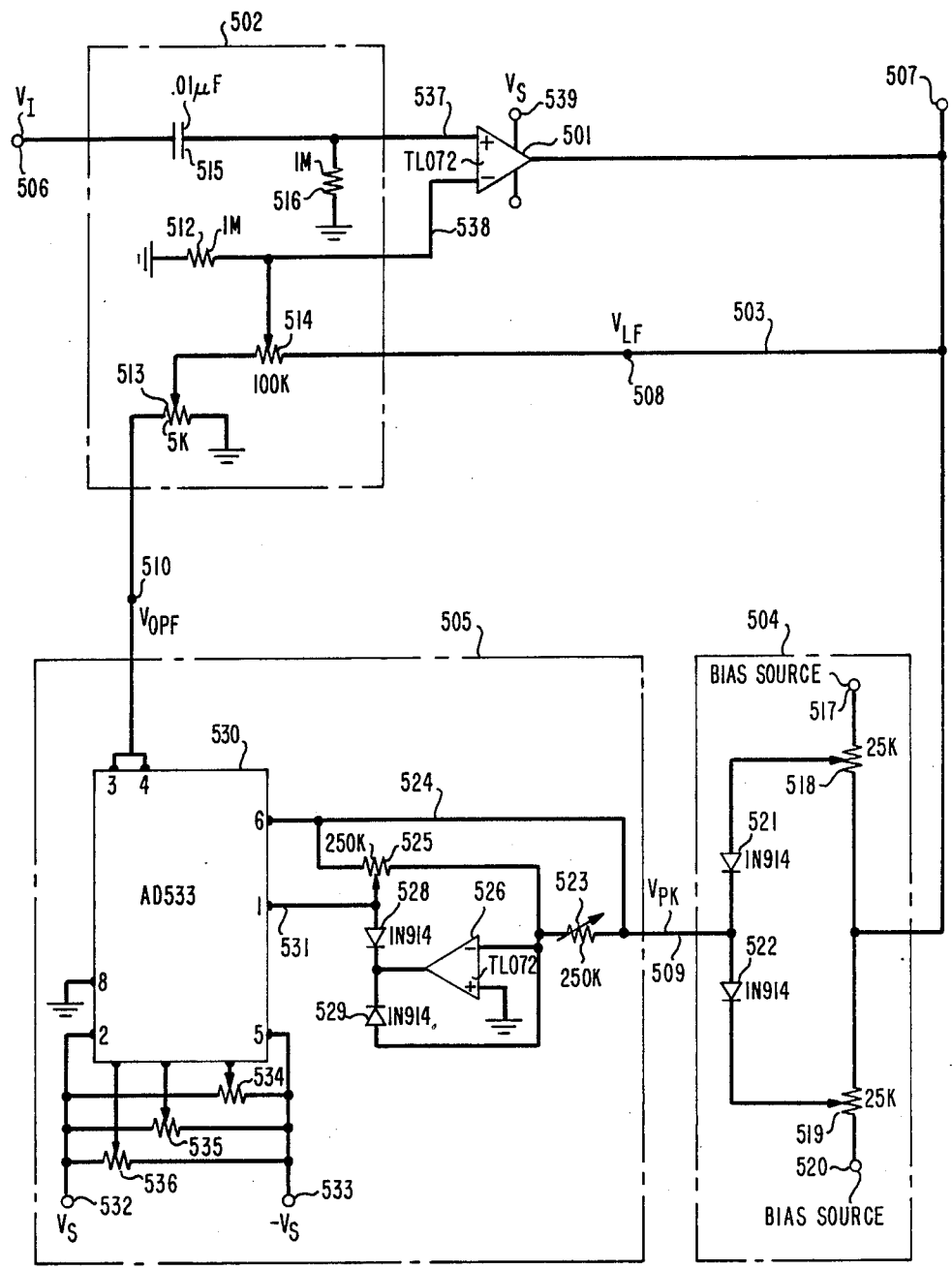
FIG. 5 is a circuit diagram of an embodiement of the present invention which utilizes an over-threshold squared voltage-feedback path.

A circuit diagram of an embodiment of the present invention, using an adjustable over-threshold squared voltage-feedback path is shown in FIG. 5. Dashed boxes are used to surround circuit elements in FIG. 5 corresponding to blocks in FIGS. 3 and 4. Box 502 corresponds to block 302 in FIG. 3. Boxes 504 and 505 correspond to blocks 403 and 405 in FIG. 4, which together correspond to block 308 in FIG. 3. Wire 503 corresponds to block 306 in FIG. 3. Texas instruments TL072 high-gain operational amplifier 501 corresponds to amplifier 305 in FIG. 3. Amplifier 501 has differential input terminals 537 and 538 driven by signal-mixing circuit 502. Wire 503 connects output 507 to circuit 502, providing linear feedback voltage 508. Output 507 also drives peak-pass circuit 504. A voltage supply of 15 Volts, not shown, is connected to terminals 532 and 539, and a supply of −15 Volts, not shown, is connected to terminals 533 and 540.

Peak-pass circuit 504 uses high-speed switching diodes 521 and 522, which conduct only when amplifier output voltage 507 is over predetermined thresholds set by bias sources, not shown, attached to terminals 517 and 520, and by potentiometers 518 and 519. Either bias current sources or bias voltage sources can be connected to terminals 517 and 520 to set thresholds. Each polarity of the amplifier output voltage signal 507 is served by one of the two parallel circuit branches in peak-pass circuit 504. Peak-pass circuit 504 is well known (e.g., "Electronics Circuits", authored by Seely in 1968, pp 271-273). Adjustable resistor 523 serves as load for peak-pass circuit 504.

When output voltage 507 is greater than a positive threshold $V_{TP}$ (predetermined by setting bias source 517 and potentiometer 518), diode 521 conducts. When diode 521 conducts, over-threshold voltage $V_{PK}$ is positive and its magnitude is equal to the difference between the output voltage $V_O$ and the positive threshold voltage $V_{TP}$, multiplied by a predetermined transfer ratio set by adjusting potentiometer 518. When output voltage 507 is less than a negative threshold $V_{TN}$ (predetermined by setting bias source 520 and potentiometer 519), diode 522 conducts. When diode 522 conducts, over-threshold voltage $V_{PK}$ is negative and its magnitude is equal to the difference between the output voltage $V_O$ and the negative threshold voltage $V_{TN}$, multiplied by a predetermined transfer ratio set by adjusting potentiometer 519.

Polarity-preserving squaring circuit 505 is well known (e.g., "IC Op-Amp Cookbook", authored by June in 1974, pp. 210–213 and 251–256). Circuit 505 uses an Analog Devices AD533 analog voltage multiplier 530, and an absolute value circuit comprising a Texas Instruments TL072 operational amplifier 526, potentiometers 523 and 523, and high-speed switching diodes 528 and 529. Non-linear feedback voltage 510 is a scaled product of the multiplier input voltages 524 and 531. Potentiometers 534, 535 and 536 are set to adjust AD533 as required by its manufacturer, Analog Devices. The embodiment shown in FIG. 5 uses a single AD533 four-quadrant analog multiplier, which responds to both signal polarities of the output signal from peak-pass circuit 504.

Embodiments of the present invention can use separate two-quadrant analog-multiplier squaring circuits for each polarity of peak-pass circuit output signal. Using a separate squaring circuit for each signal polarity requires separately connecting the output terminals of diodes 521 and 522 to each of the two squaring circuits, which in effect creates two over-threshold power-function feedback paths.

When peak-over-threshold voltage 509 is less than zero, diode 528 conducts and diode 529 is open, resulting in an inverting amplifier configuration between voltages 509 and 531. In this mode the inverting amplifier has a sub-unity gain set by adjusting potentiometer 525 and resistor 523. When peak-over-threshold voltage 509 is greater than zero, diode 528 is open and diode 529 conducts, resulting in a voltage divider configuration between voltages 509 and 531. In this configuration, the voltage divider has a transfer ratio set by adjusting potentiometer 525.

The voltage 531 is a scaled absolute value of peak-over-threshold voltage 509. The polarity of the over-threshold squared feedback voltage 510 is the same as 509, and its magnitude is proportional to the square of 509. The constant of proportionality is separately adjustable for each signal polarity, as are the positive and negative threshold voltages. The circuits in boxes 504 and 505 substantially follow Equations 1 and 2, where $S_O$, $S_{PK}$, and $S_{FN}$ are voltage signals, and constants b and c are both equal to 2.

Signal-mixing circuit 502 uses capacitor 515 and resistor 516 to pass input voltage 506 to positive amplifier input terminal 537. Resistor 512 and potentiometers 513 and 514 pass feedback voltages 508 and 510 to negative amplifier input terminal 538, resulting in negative feedback. Linear and over-threshold squared feedback levels are set by adjusting potentiometers 513 and 514.

Figure 6:
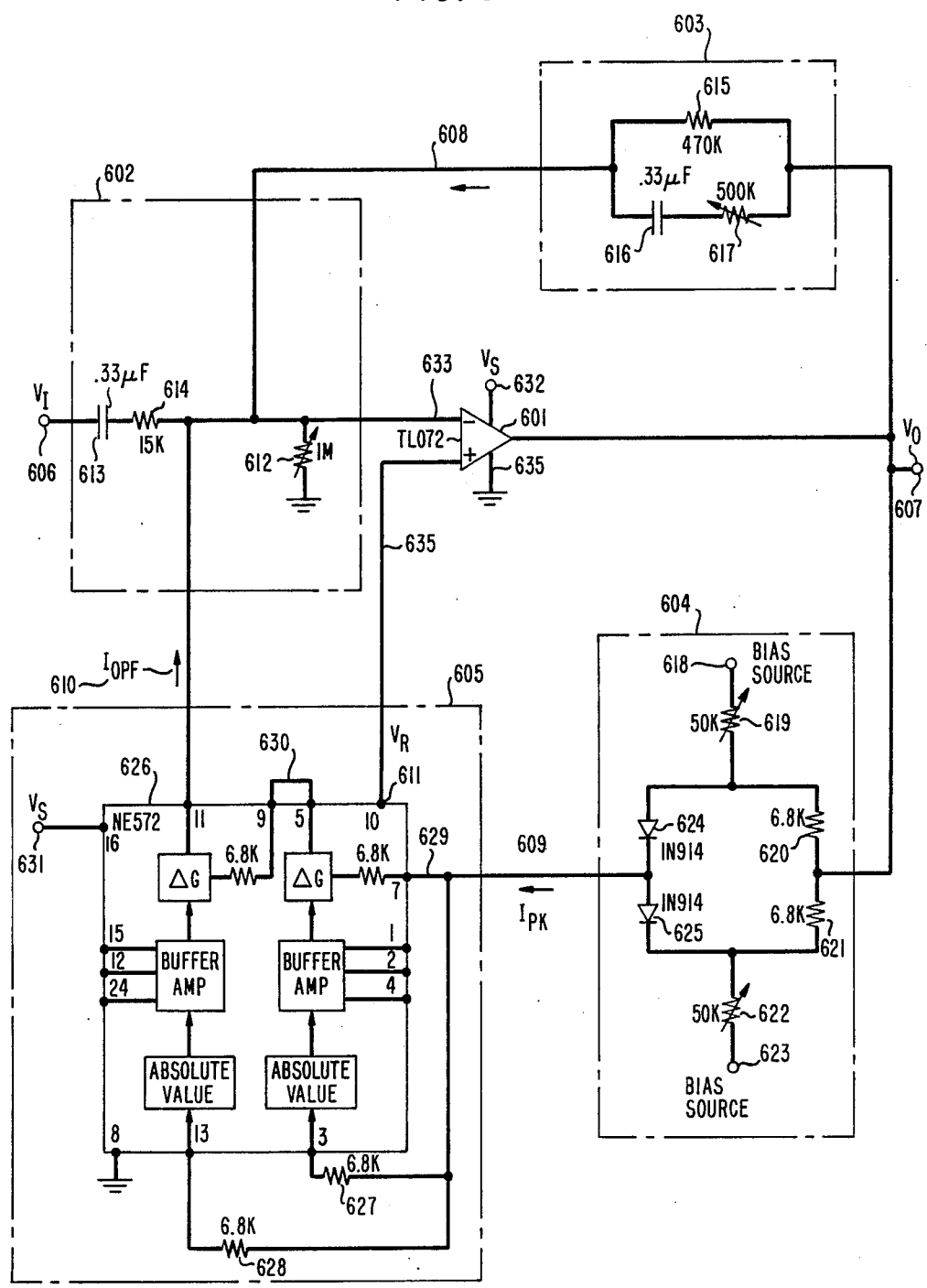
FIG. 6 is a circuit diagram of an embodiment of the present invention which utilizes an over-threshold cubed current-feedback path.

A circuit diagram of another embodiment of the present invention, having an adjustable over-threshold cubed current-feedback path, is shown in FIG. 6. Dotted line boxes are used to surround circuit elements in FIG. 6, corresponding to blocks in FIG. 3 and FIG. 4. Box 602 corresponds to block 302 in FIG. 3. Boxes 604 and 605 correspond to blocks 403 and 406 in FIG. 4, which together correspond to block 308 in FIG. 3. Box 603 corresponds to block 306 in FIG. 3. A Texas Instruments TL072 high-gain operational amplifier 601 is used as an embodiment of amplifier 305 in FIG. 3.

Amplifier 601 has differential input terminals 633 and 634 driven by signal-mixing circuit 602. The output DC bias voltage level of amplifier 601 is set using nominal 2.5 Volt reference voltage 611 (provided by Signetics NE572 integrated circuit 626), adjustable resistor 612 and DC feedback resistor 615. A 9 Volt voltage supply, not shown, is connected to terminals 631 and 632. Output voltage 607 drives linear feedback element 603 and peak-pass circuit 604.

Peak-pass circuit 604 is well-known and similar to circuit 504 in FIG. 5. Resistors 627, 628 and NE572 internal resistor connected to input terminal 629, together serve as load for peak-pass circuit 604. Either bias voltage sources or bias current sources, not shown, are connected to terminals 618 and 623 to set threshold. When output voltage 607 is greater than a positive threshold $V_{TP}$ (predetermined by setting bias source 618 and resistors 619 and 620), diode 624 conducts. When diode 624 conducts, peak-over-threshold current 609 is positive and its magnitude is equal to the difference between the output voltage 607 and the positive threshold voltage $V_{TP}$, multiplied by a transconductance set by resistors 619 and 620. When output voltage 607 is less than a negative threshold $V_{TN}$ (predetermined by setting bias source 623 and resistors 621 and 622), diode 625 conducts. When diode 625 conducts, peak-over-threshold current 609 is negative and its magnitude is equal to the difference between the output voltage $V_O$ and negative threshold voltage $V_{TN}$, multiplied by a transconductance set by resistors 622 and 621.

Polarity-preserving cubing circuit 605 is realized using Signetics NE572 integrated circuit 625, connected as shown. NE572 buffer amp terminals, which can be used to connecting components for setting attack and release times, are left unconnected (NC). This allows integrated circuit 626 to provide a pair of four-quadrant analog current multipliers, with each multiplier having one input driven by an internal absolute value circuit.

Peak-over-threshold current 609 is divided evenly into three separate NE572 input currents by resistors 628, 627 and an internal resistor connected to input terminal 629. The current through jumper wire 630 is proportional to a polarity-preserved square of peak-over-threshold current 609 (an over-threshold squared feedback current could be realized by disconnecting jumper wire 630 and connecting output of the first current multiplier directly to signal mixing means 602, leaving the second NE572 stage unused). To realize over-threshold cubed current feedback, jumper wire 630 is used to drive one input of the second current multiplier stage. The other input of the second current multiplier stage is connected to accept the current through resistor 628.

Output 610 is over-threshold cubed feedback current, having the same polarity as peak-over-threshold current 609, and having magnitude proportional to the peak-over-threshold current level raised to the third power. The constant of proportionality is separately adjustable for each signal polarity, as are positive and negative threshold voltages. The circuits in boxes 604 and 605 substantially follow Equations 1 and 2, where $S_O$ is a voltage signal, $S_{PK}$ and $S_{FN}$ are current signals, and constants b and c are both equal to 3.

The linear AC gain of the system in FIG. 6 is set by adjusting AC feedback resistor 617 in series with capacitor 616. Signal-mixing circuit 602 mixes negative feedback currents 608 and 610 with input current through resistor 614 in series with capacitor 613, to drive amplifier negative input terminal 633.

The embodiments described herein are intended to be illustrative of the general principles of the present invention. Various modifications are possible consistent with the spirit of the invention. Other forms of peak-pass means and polarity-preserving power-function means are possible, consistent with the present invention. For example, several well-known forms of polarity-preserving power-function means are shown in FIGS. 7, 8, 9, 10, 11, 12, 13, 14, and 15.

FIGS. 7, 8, 9, and 10 are block diagrams of embodiments of polarity-preserving power-function means responsive to peak-over-threshold signals having both positive and negative polarities. Each corresponds to block 406 in FIG. 4, thus FIGS. 7, 8, 9, and 10 show peak-over-threshold signal 401 as input and over-threshold power-function feedback signal 309 as output.

Figure 7:
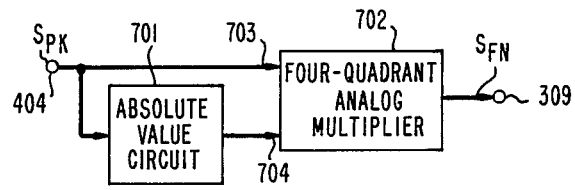
FIG. 7 is a block diagram of an embodiment of a polarity-preserving squaring means, responsive to bipolar signals.

FIG. 7 is a block diagram of an embodiment of a polarity-preserving squaring means. Peak-over-threshold signal 404 drives one input 703 of four-quadrant multiplier 702 and absolute value circuit 701. The other input 704 of multiplier 702 is driven by output of absolute value circuit 701. Output of multiplier 702 provides over-threshold squared feedback signal 309, which has the same polarity as signal 404.

Figure 8:
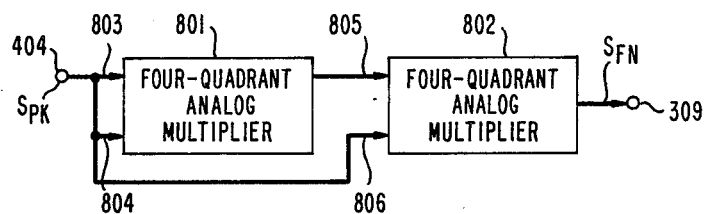
FIG. 8 is a block diagram of an embodiment of a polarity-preserving cubing means, responsive to bipolar signals.

FIG. 8 is a block diagram of an embodiment of a polarity-preserving cubing means. Signal 404 drives inputs 803 and 804 of multiplier 801 and input 806 of multiplier 802. Input 805 of multiplier 802 is driven by output of multiplier 801. Output of multiplier 802 provides over-threshold cubed feedback signal 309. Signal 805 has positive polarity, and feedback signal 309 has the same polarity as peak-over-threshold signal 404.

Figure 9:
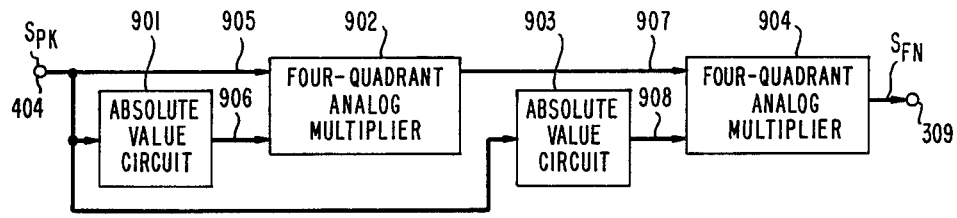
FIG. 9 is a block diagram of another embodiment of a polarity-preserving cubing means, responsive to bipolar signals.

FIG. 9 is a block diagram of another embodiment of a polarity-preventing cubing circuit. Signal 404 drives absolute value circuits 901 and 903, and input 905 of multiplier 902. The other input 906 of multiplier 902 is driven by output of absolute value circuit 901. Input 907 of multiplier 904 is driven by output of multiplier 902, and the other input 908 of multiplier 904 is driven by output of absolute value circuit 903. Output of second multiplier 902 provides over-threshold cubed feedback signal 309. Signal 907 and feedback signal 309 both have the same polarity as peak-over-threshold signal 404.

Figure 10:
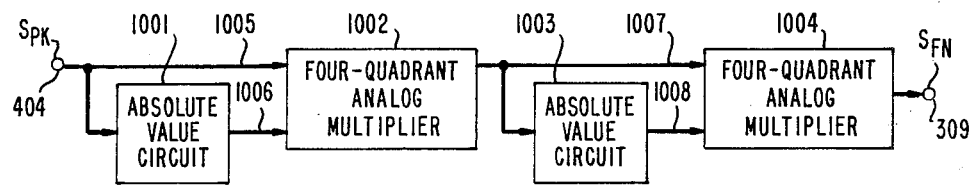
FIG. 10 is a block diagram of an embodiment of a polarity-preserving fourth-power means, responsive to bipolar signals.

FIG. 10 is a block diagram of an embodiment of a polarity-preserving fourth power circuit. Signal 404 drives one input 1005 of multiplier 1002 and absolute value circuit 1001. The other input 1006 of multiplier 1002 is driven by output of absolute value circuit 1001. Output of multiplier 1002 drives one input 1007 of multiplier 1004 and absolute value circuit 1003. The other input 1008 of multiplier 1004 is driven by output of absolute value circuit 1003. Output of second multiplier 1004 provides over-threshold fourth power feedback signal 309, which has the same polarity as signal 404.

FIGS. 11, 12, 13, and 14 are block diagrams of embodiments of polarity-preserving power-function means, responsive to peak-over-threshold signals having only positive polarity. Each corresponds to block 406 in FIG. 4, thus FIGS. 11, 12, 13, and 14 show peak-over-threshold signal 401 as input and over-threshold power-function feedback signal 309 as output.

Figure 11:
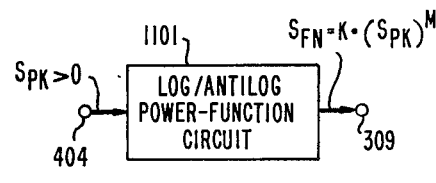
FIG. 11 is a block diagram of a log/antilog power-function means, responsive to positive signals.

FIG. 11 is a block diagram of an embodiment of a polarity-preserving power function means using a log-/antilog power-function circuit, which only allows input signal 404 having positive polarity. Circuit 1101 is a combination logarithmic converter and antilog generator, with a variable scale adjustment between the log-/antilog interface. Log/antilog power-function generators are well known, and are available as integrated circuits (e.g., Analog Devices AD433 which can realize a power function with any exponent between 0.5 and 5).

Figure 12:
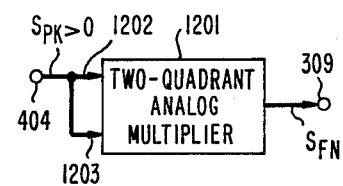
FIG. 12 is a block diagram of a squaring means, responsive to positive signals only.
Figure 13:
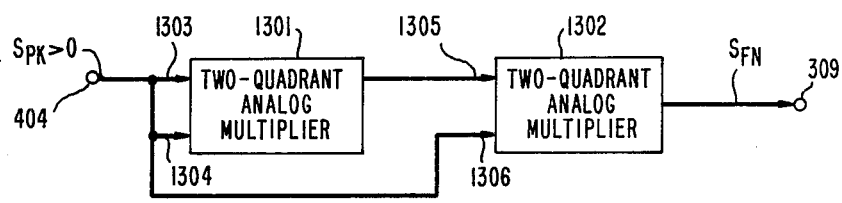
FIG. 13 is a block diagram of a cubing means, responsive to positive signals only.
Figure 14:
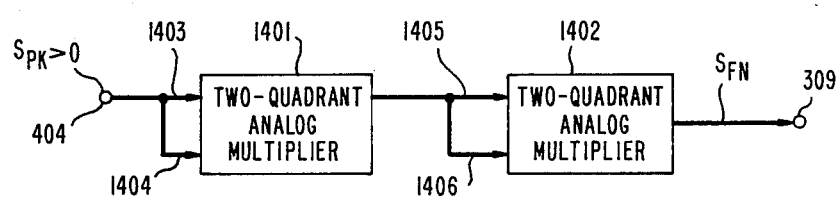
FIG. 14 is a block diagram of a fourth-power means, responsive to positive signals only; and, FIG. 15 is a block diagram showing how a power-function means, responsive to positive signals only, can be used with negative signals.

FIGS. 12, 13, and 14 corresponds to FIGS. 7, 9, and 10, for use with input signal 404 having only positive polarity. For positive-polarity peak-over-threshold signal 404, absolute value circuits 701, 901, 903, 1001, and 1003 in FIGS. 7, 9, and 10 can be made null, and multipliers 702, 902, 904, 1002, and 1004 can be two-quadrant multipliers. Making these substitutions results in FIGS. 12, 13 and 14.

Figure 15:
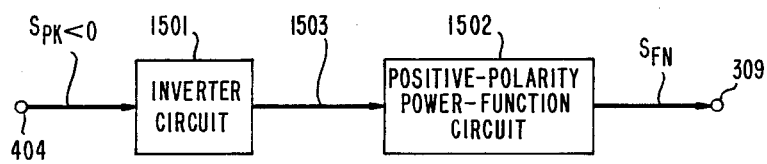

FIG. 15 shows how any positive-polarity power-function circuit, such as those shown in FIGS. 11, 12, 13 and 14, can be used with input signal 404 having negative polarity. Inverter circuit 1501 changes polarity of input signal 404, providing positive-polarity signal 1503 as input to power-function circuit 1502. Feedback signal 309 is of opposite pularity to signal 404, and the signal-mixing circuit, as shown in block 302 in FIG. 3, must be designed to insure that signal 309 properly applied as negative feedback.

What is claimed is:

1. A circuit, responsive to an input signal, for use with an amplifier, which circuit comprises;
    a signal-mixing means for providing an input signal to the amplifier in response to the input signal and at least one over-threshold power-function negative feedback signal; and
    at least one negative feedback means for providing the at least one over-threshold power-function negative feedback signal in response to the amplifier output signal, which comprises:
    (a) a peak-pass means, responsive to the amplifier output signal, for picking off predetermined portions of the amplifier output signal, to produce a peak-over-threshold signal, and
    (b) a polarity-preserving power-function means, responsive to the peak-over-threshold signal, for producing the at least one over-threshold power-function negative feedback signal having an amplitude which is proportional to the peak-over-threshold signal level raised to a power greater than one.

2. The circuit of claim 1 wherein the peak-pass means comprises means for picking off predetermined portions of the amplifier output above a first predetermined threshold.

3. The circuit of claim 1 wherein the peak-pass means comprises means for picking off predetermined portions of the amplifier output below a second predetermined threshold.

4. The circuit of claim 2 wherein the peak-pass means comprises means for varying the first predetermined threshold.

5. The circuit of claim 3 wherein the peak-pass means comprises means for varying the second predetermined threshold.

6. The circuit of claim 2 wherein the peak-pass means further comprises means for varying the amplitude of the predetermined portions picked off.

7. The circuit of claim 3 wherein the peak-pass means further comprises means for varying the amplitude of the predetermined portions picked off.

8. The circuit of claim 1 wherein the peak-pass means further comprises:
    (a) means for picking off first predetermined portions of the amplifier output above a first predetermined threshold;
    (b) means for picking off second predetermined portions of the amplifier output below a second predetermined threshold;
    (c) means for varying the first predetermined threshold;

(d) means for varying the second predetermined threshold;
(e) means for varying the amplitude of the first predetermined portions picked off; and,
(f) means for varying the amplitude of the second predetermined portions picked off.

9. The circuit of claim 1 wherein the polarity-preserving power-function means further comprises means for producing an over-threshold power-function feedback signal having the same polarity as the predetermined portions picked off.

10. The circuit of claim 1 wherein the polarity-preserving power-function means further comprises means for producing an over-threshold power-function feedback signal having opposite polarity to the predetermined portions picked off.

11. The circuit of claim 1 wherein the polarity-preserving power function means provides an over-threshold power-function negative feedback signal having an amplitude which is proportional to the peak-over-threshold signal level raised to the third power.

12. The circuit of claim 1 which further comprises a linear feedback means, responsive to the amplifier output signal, for producing a linear feedback signal which is applied to the signal-mixing means.

13. The circuit of claim 1 wherein the peak-pass means comprises:
a resistor which is connected at one end to the amplifier output and connected at the other end to a first end of a diode and to a second resistor in series with a bias means, the other end of the diode comprising the output of the peak-pass means.

14. The circuit of claim 13 wherein the bias means is a voltage source.

15. The circuit of claim 13 wherein the bias means is a current source.

16. The circuit of claim 1 wherein the polarity-preserving power-function means provides an over-threshold power-function negative feedback signal having an amplitude which is proportional to the peak-over-threshold signal level raised to the second power, which polarity-preserving power-function means comprises:
an absolute value means, responsive to the output of the peak-pass means; and
an analog multiplier, responsive at an input to the output of the peak-pass means and responsive at a second input to the output of the absolute value means, for producing the output of the polarity-preserving power-function means.

17. The circuit of claim 1 wherein the polarity-preserving power-function means provides an over-threshold power-function negative feedback signal having an amplitude which is proportional to the peak-over-threshold signal level raised to the third power, which polarity-preserving power-function means comprises:
a first absolute value means, responsive to the output of the peak-pass means;
a first analog multiplier, responsive at an input to the output of the peak-pass means and responsive at a second input to the output of the first absolute value means;
a second absolute value means, responsive to the output of the peak-pass means; and
a second analog multiplier, responsive at an input to the output of the first analog multiplier and responsive at a second input to the output of the second absolute value means, for producing the output of the polarity-preserving power-function means.

18. The circuit of claim 1 wherein the polarity-preserving power-function means provides an over-threshold power-function negative feedback signal having an amplitude which is proportional to the peak-over-threshold signal level raised to the third power, which polarity-preserving power-function means comprises;
a first analog multiplier, responsive at an input to the output of the peak-pass means and responsive at a second input to the output of the peak-pass means; and
a second analog multiplier, responsive at an input to the output of the first analog multiplier and responsive at a second input to the output of the peak-pass means, for producing the output of the polarity-preserving power-function means.

19. The circuit of claim 1 wherein the polarity-preserving power-function means provides an over-threshold power-function negative feedback signal having an amplitude which is proportional to the peak-over-threshold signal level raised to the fourth power, which polarity-preserving power-function means comprises:
a first absolute value means, responsive to the output of the peak-pass means;
a first analog multiplier, responsive at an input to the output of the peak-pass means and responsive at a second input to the output of the first absolute value means;
a second absolute value means, responsive to the output of the first analog multiplier; and
a second analog multiplier, responsive at an input to the output of the first analog multiplier and responsive at a second input to the output of the second absolute value means, for producing the output of the polarity-preserving power-function means.

20. The circuit of claim 2 wherein the polarity-preserving power-function means comprises;
a logarithmic converter, responsive to the output of the peak-pass means, for providing a signal proportional to the logarithm of the peak-over-threshold signal level;
a scale adjusting means, responsive to the output of the logarithmic converter; and
an antilogarithmic converter, responsive to the output of the scale adjusting means, for producing the output of the polarity-preserving power-function means.

21. The circuit of claim 3 wherein the polarity-preserving power-function means comprises:
an inverter circuit, responsive to the output of the peak-pass means, for producing a signal proportional to the additive inverse of the peak-over-threshold signal;
a logarithmic converter, responsive to the output of the inverter circuit, for providing a signal proportional to the logarithm of the additive inverse of the peak-over-threshold signal level;
a scale adjusting means, responsive to the output of the logarithmic converter; and
an antilogarithmic converter, responsive to the output of the scale adjusting means, for producing the output of the polarity-preserving power-function means.

22. The circuit of claim 3 wherein the polarity-preserving power-function means comprises;

an inverter circuit, responsive to the output of the peak-pass means, for producing a signal proportional to the additive inverse of the peak-over-threshold signal; and a power-function means, responsive to the ouput of the inverter circuit, for producing the output of the polarity-preserving power-function means.

* * * * *